(12) United States Patent
Orihashi et al.

(10) Patent No.: US 12,503,762 B2
(45) Date of Patent: Dec. 23, 2025

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yugo Orihashi, Toyama (JP); Yasuhiro Megawa, Toyama (JP); Kotaro Murakami, Toyama (JP); Kensuke Haga, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 622 days.

(21) Appl. No.: 17/679,730

(22) Filed: Feb. 24, 2022

(65) Prior Publication Data
US 2022/0178019 A1    Jun. 9, 2022

Related U.S. Application Data

(63) Continuation of application No. PCT/JP2019/038376, filed on Sep. 27, 2019.

(30) Foreign Application Priority Data

Sep. 20, 2019   (JP) ................. 2019-171532

(51) Int. Cl.
*C23C 16/44* (2006.01)
*H01L 21/02* (2006.01)
*H01L 21/67* (2006.01)

(52) U.S. Cl.
CPC .... *C23C 16/4405* (2013.01); *H01L 21/02532* (2013.01); *H01L 21/02576* (2013.01);
(Continued)

(58) Field of Classification Search
None
See application file for complete search history.

(56) References Cited

U.S. PATENT DOCUMENTS

| | | | |
|---|---|---|---|
| 5,954,887 A | 9/1999 | Hatano | |
| 2002/0011465 A1* | 1/2002 | Yamamoto | C04B 41/91 216/2 |

(Continued)

FOREIGN PATENT DOCUMENTS

| | | |
|---|---|---|
| JP | 11-016858 A | 1/1999 |
| JP | 2001-131751 A | 5/2001 |

(Continued)

OTHER PUBLICATIONS

International Search Report, PCT/JP2019/038376, Dec. 10, 2019, 5 pgs.

(Continued)

*Primary Examiner* — Kaj K Olsen
*Assistant Examiner* — Arlyn I Rivera-Cordero
(74) *Attorney, Agent, or Firm* — Volpe Koenig

(57) ABSTRACT

There is provided a technique that includes performing a cycle a predetermined number of times, the cycle including: (a) executing a process recipe of processing a substrate by supplying a process gas to an interior of a process container that accommodates the substrate in a state in which the interior of the process container is heated; and (b) executing a cleaning recipe of cleaning the interior of the process container by supplying a cleaning gas to the interior of the process container that does not accommodate the substrate in the state in which the interior of the process container is heated, wherein a time from an end of (b) in the cycle until a start of (a) in a next cycle is set to be equal to or less than a time from an end of (a) in the cycle until a start of (b) in the cycle.

23 Claims, 4 Drawing Sheets

(52) U.S. Cl.
CPC .... *H01L 21/02579* (2013.01); *H01L 21/0262* (2013.01); *H01L 21/67098* (2013.01); *H01L 21/67248* (2013.01)

(56) References Cited

U.S. PATENT DOCUMENTS

| | | |
|---|---|---|
| 2005/0000423 A1 | 1/2005 | Kasai et al. |
| 2017/0087606 A1 | 3/2017 | Nakamura et al. |
| 2019/0144994 A1 | 5/2019 | Okada et al. |
| 2019/0255576 A1 | 8/2019 | Kuribayashi et al. |

FOREIGN PATENT DOCUMENTS

| | | |
|---|---|---|
| JP | 2002-222805 A | 8/2002 |
| JP | 2008-214763 A | 9/2008 |
| JP | 2017-069230 A | 4/2017 |
| JP | 2019-091763 A | 6/2019 |
| JP | 2019-145705 A | 8/2019 |
| WO | 2011/013810 A1 | 2/2011 |

OTHER PUBLICATIONS

Korean Office Action issued on Nov. 20, 2023 for Korean Patent Application No. 10-2022-7005513, 15 Pages.
Singapore Written Opinion issued on Jul. 3, 2023 for Singapore Patent Application No. 11202201708Y, 6 Pages.

\* cited by examiner (Reference Example)

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a Bypass Continuation Application of PCT International Application No. PCT/JP2019/038376, filed on Sep. 27, 2019, the international application being based upon and claiming the benefit of priority from Japanese Patent Application No. 2019-171532, filed on Sep. 20, 2019, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

As a process of manufacturing a semiconductor device, a step of supplying a process gas to an interior of a process container that accommodates a substrate to process the substrate and a step of supplying a cleaning gas to the interior of the process container that does not accommodate the substrate to clean the interior of the process container may be often repeatedly carried out.

SUMMARY

Some embodiments of the present disclosure provide a technique capable of improving the characteristics of a film formed on a substrate.

According to one embodiment of the present disclosure, there is provided a technique that includes performing a cycle a predetermined number of times, the cycle including: (a) executing a process recipe of processing a substrate by supplying a process gas to an interior of a process container that accommodates the substrate in a state in which the interior of the process container is heated; and (b) executing a cleaning recipe of cleaning the interior of the process container by supplying a cleaning gas to the interior of the process container that does not accommodate the substrate in the state in which the interior of the process container is heated, wherein a time from an end of (b) in the cycle until a start of (a) in a next cycle is set to be equal to or less than a time from an end of (a) in the cycle until a start of (b) in the cycle.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

One embodiment of the present disclosure will be now described mainly with reference to FIGS. 1 to 4A.

(1) Configuration of Substrate Processing Apparatus

Figure 1:
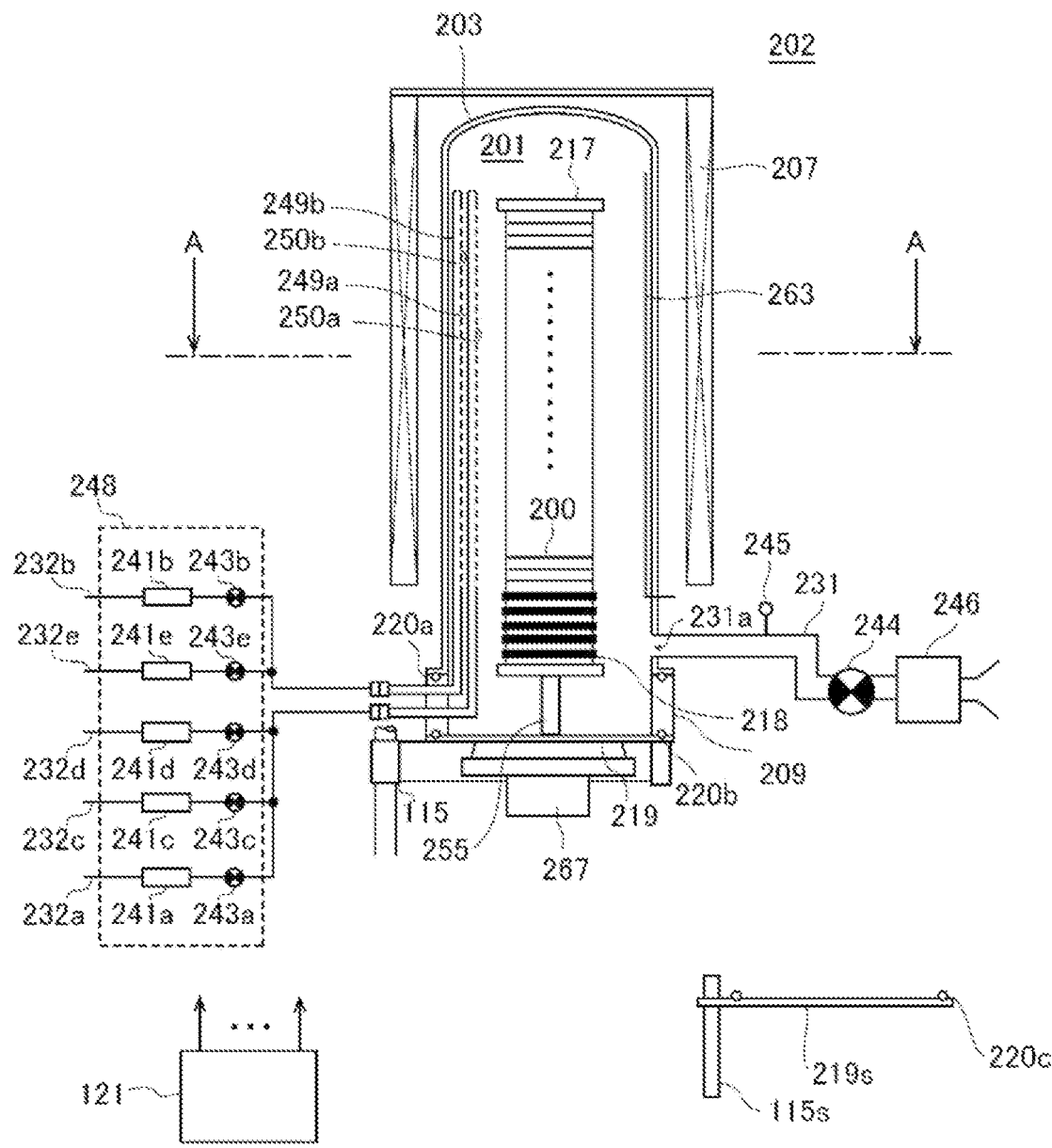
FIG. 1 is a schematic configuration view of a vertical process furnace of a substrate processing apparatus suitably used in an embodiment of the present disclosure, in which a portion of the process furnace is shown in a vertical cross section.

As shown in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an exciter) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and has a cylindrical shape with both of its upper and lower ends opened. The upper end portion of the manifold 209 engages with the lower end portion of the reaction tube 203 so as to support the reaction tube 203. An O-ring 220a serving as a seal is provided between the manifold 209 and the reaction tube 203. Similar to the heater 207, the reaction tube 203 is vertically installed. A process container (reaction container) is mainly constituted by the reaction tube 203 and the manifold 209. A process chamber 201 is formed in a hollow cylindrical portion of the process container. The process chamber 201 is configured to be capable of accommodating wafers 200 as substrates. Processing on the wafers 200 is performed in the process chamber 201.

Nozzles 249a and 249b serving as first and third supply parts, respectively, are provided in the process chamber 201 so as to penetrate through a sidewall of the manifold 209. The nozzles 249a and 249b are also referred to as first and third nozzles, respectively. The nozzles 249a and 249b are made of a non-metal material which is a heat resistant material such as quartz or SiC. The nozzles 249a and 249b are configured as common nozzles to be used for supplying a plurality of types of gases, respectively.

Gas supply pipes 232a and 232b serving as first and second pipes, respectively, are connected to the nozzles 249a and 249b, respectively. The gas supply pipes 232a and 232b are configured as common pipes to be used for supplying a plurality of types of gases, respectively. Mass flow controllers (MFCs) 241a and 241b, which are flow rate controllers (flow rate control parts), and valves 243a and 243b, which are opening/closing valves, are provided in the gas supply pipes 232a and 232b, respectively, sequentially from the upstream side of a gas flow. Gas supply pipes 232c and 232d are connected to the gas supply pipe 232a at the downstream side of the valves 243a. MFCs 241c and 241d and valves 243c and 243d are provided in the gas supply pipes 232c and 232d, respectively, sequentially from the upstream side of a gas flow. A gas supply pipe 232e is connected to the gas supply pipe 232b at the downstream side of the valve 243b. A MFC 241e and a valve 243e are provided in the gas supply pipe 232e sequentially from the upstream side of a gas flow. The gas supply pipes 232a to 232e are made of, for example, a metal material such as SUS.

Figure 2:
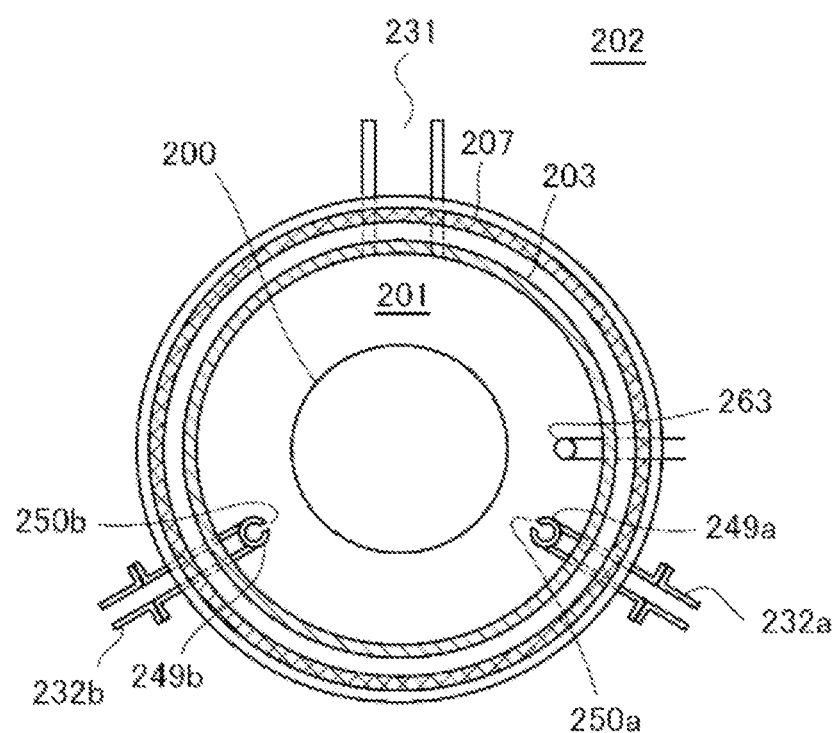
FIG. 2 is a schematic configuration view of the vertical process furnace of the substrate processing apparatus suitably used in the embodiment of the present disclosure, in which a portion of the process furnace is shown in a cross section taken along line A-A in FIG. 1.

As shown in FIG. 2, each of the nozzles 249a and 249b is disposed in an annular space in a plan view between an inner wall of the reaction tube 203 and the wafers 200 so as to extend upward from a lower portion of the inner wall of the reaction tube 203 to an upper portion thereof, that is, along an arrangement direction of the wafers 200. Specifically, each of the nozzles 249a and 249b is provided in a region horizontally surrounding a wafer arrangement region in which the wafers 200 are arranged at a lateral side of the wafer arrangement region, along the wafer arrangement region. Gas supply holes 250a and 250b for supplying a gas are formed on the side surfaces of the nozzles 249a and 249b, respectively. Each of the gas supply holes 250a and 250b is opened toward the centers of the wafer 200s in a plan view, which enables a gas to be supplied toward the wafers 200. A plurality of gas supply holes 250a and 250b are formed from the lower portion of the reaction tube 203 to the upper portion thereof.

A process gas (precursor gas), for example, a silane-based gas containing silicon (Si), which is a main element constituting a film formed on the wafers 200, is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state at room temperature and atmospheric pressure, or a precursor which remains in a gas state at room temperature and atmospheric pressure. As the silane-based gas, for example, a monosilane ($SiH_4$, abbreviation: MS) gas such as a silicon hydride gas can be used.

A dopant gas, for example, a gas containing an impurity (dopant), is supplied from the gas supply pipe 232b into the process chamber 201 via the MFC 241b, the valve 243b, and the nozzle 249b. As the dopant gas, a gas containing any one of a group III element (group XIII element) and a group V element (group XV element), for example, a phosphine ($PH_3$, abbreviation: PH) gas which is a gas containing phosphorus (P) as a group V element, can be used.

A cleaning gas, for example, a halogen-containing gas, is supplied from the gas supply pipe 232c into the process chamber 201 via the MFC 241c, the valve 243c, the gas supply pipe 232a, and the nozzle 249a. The halogen includes chlorine (Cl), fluorine (F), bromine (Br), iodine (I), and the like. As the halogen-containing gas, for example, a fluorine ($F_2$) gas, which is a F-containing gas, can be used.

An inert gas, for example, a nitrogen ($N_2$) gas, is supplied from the gas supply pipes 232d and 232e into the process chamber 201 via the MFCs 241d and 241e, the valves 243d and 243e, the gas supply pipes 232a and 232b, and the nozzles 249a and 249b, respectively. The $N_2$ gas acts as a purge gas, a carrier gas, a dilution gas, or the like.

A process gas supply system (precursor gas supply system) mainly includes the gas supply pipe 232a, the MFC 241a, and the valve 243a. A dopant gas supply system mainly includes the gas supply pipe 232b, the MFC 241b, and the valve 243b. The process gas supply system may include the dopant gas supply system. A cleaning gas supply system mainly includes the gas supply pipe 232c, the MFC 241c, and the valve 243c. An inert gas supply system mainly includes the gas supply pipes 232d and 232e, the MFCs 241d and 241e, and the valves 243d and 243e.

One or all of the above-described various supply systems may be configured as an integrated-type supply system 248 in which the valves 243a to 243e, the MFCs 241a to 241e, and so on are integrated. The integrated-type supply system 248 is connected to each of the gas supply pipes 232a to 232e. In addition, the integrated-type supply system 248 is configured such that operations of supplying various gases into the gas supply pipes 232a to 232e (that is, the opening/closing operation of the valves 243a to 243e, the flow rate adjustment operation by the MFCs 241a to 241e, and the like) are controlled by a controller 121 which will be described later. The integrated-type supply system 248 is configured as an integral type or detachable-type integrated unit, and may be attached to and detached from the gas supply pipes 232a to 232e and the like on an integrated unit basis, so that the maintenance, replacement, extension, etc. of the integrated-type supply system 248 can be performed on an integrated unit basis.

An exhaust port 231a for exhausting an internal atmosphere of the process chamber 201 is provided below the sidewall of the reaction tube 203. The exhaust port 231a may be provided from a lower portion of the sidewall of the reaction tube 203 to an upper portion thereof, that is, along the wafer arrangement region. An exhaust pipe 231 is connected to the exhaust port 231a. The exhaust pipe 231 is made of, for example, a metal material such as SUS. A vacuum exhaust device, for example, a vacuum pump 246, is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure adjustment part). The APC valve 244 is configured to perform or stop a vacuum exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to hermetically seal a lower end opening of the manifold 209, is provided under the manifold 209. The seal cap 219 is made of, for example, a metal material such as SUS, and is formed in a disc shape. An O-ring 220b, which is a seal making contact with the lower end of the manifold 209, is provided on an upper surface of the seal cap 219. A rotator 267 configured to rotate a boat 217, which will be described later, is installed under the seal cap 219. A rotary shaft 255 of the rotator 267 is made of, for example, a metal material such as SUS, and is connected to the boat 217 through the seal cap 219. The rotator 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer system (transfer mechanism) which loads/unloads (transfers) the wafers 200 into/out of the process chamber 201 by moving the seal cap 219 up and down.

A shutter 219s, which serves as a furnace opening cover configured to hermetically seal a lower end opening of the manifold 209 in a state where the seal cap 219 is lowered and the boat 217 is unloaded from the process chamber 201, is provided under the manifold 209. The shutter 219s is made of, for example, a metal material such as SUS, and is formed in a disc shape. An O-ring 220c, which is a seal making contact with the lower end of the manifold 209, is provided on an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is provided along the inner wall of the reaction tube 203.

Figure 3:
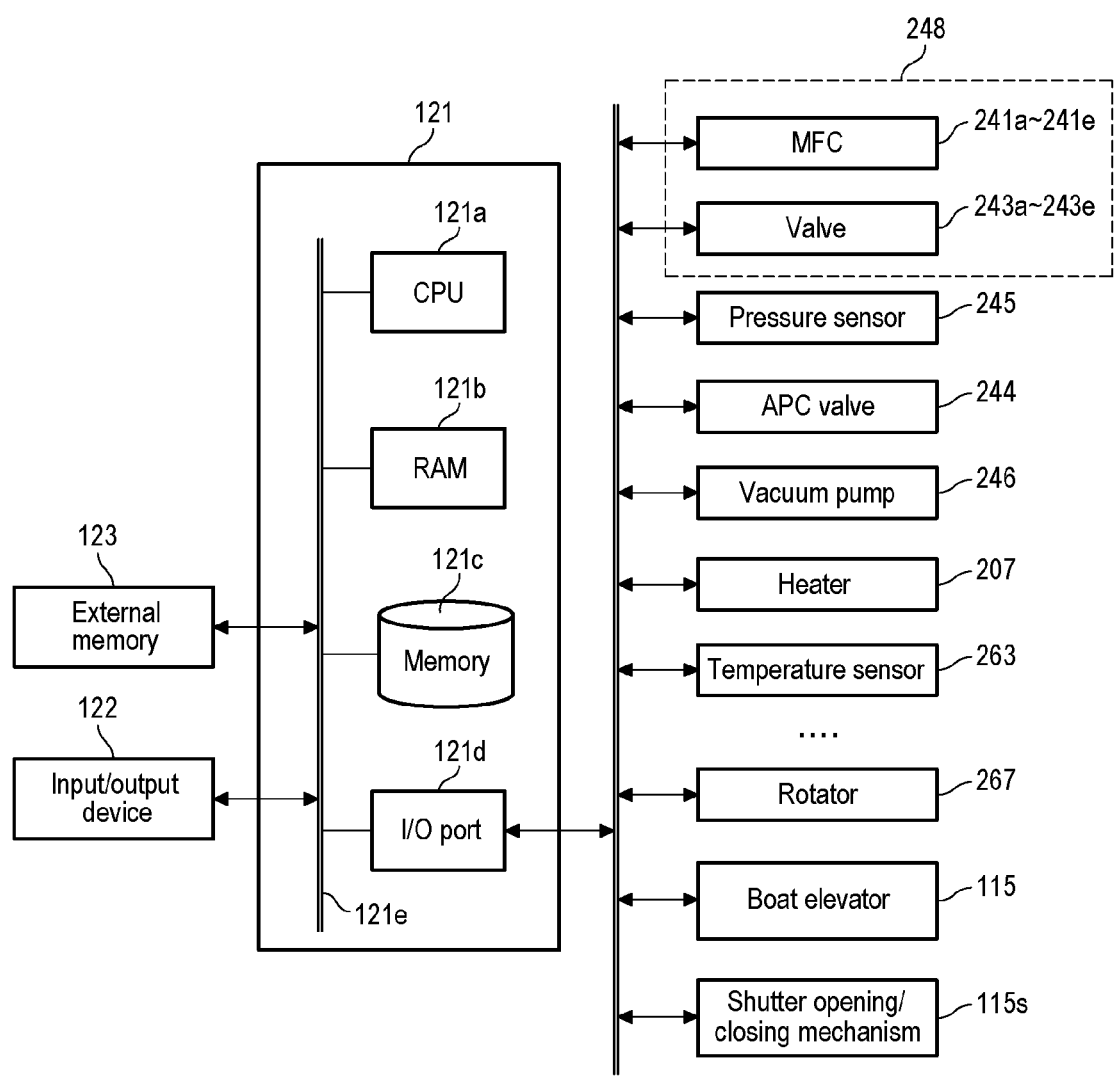
FIG. 3 is a schematic configuration diagram of a controller of the substrate processing apparatus suitably used in the embodiment of the present disclosure, in which a control system of the controller is shown in a block diagram.

As shown in FIG. 3, a controller 121, which is a control part (control means), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121.

The memory 121c is configured by, for example, a flash memory, a hard disk drive (HDD), or the like. A control program for controlling operations of a substrate processing apparatus, a process recipe in which sequences and conditions of film formation to be described later are written, a cleaning recipe in which sequences and conditions of cleaning to be described later are written, etc. are readably stored in the memory 121c. The process recipe functions as a program for causing the controller 121 to execute each sequence in the film formation, which will be described later, to obtain an expected result. The cleaning recipe functions as a program for causing the controller 121 to execute each sequence in the cleaning, which will be described later, to obtain an expected result. Hereinafter, the process recipe, the cleaning recipe, and the control program may be generally and simply referred to as a "program." Furthermore, the process recipe and the cleaning recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotator 267, the boat elevator 115, the shutter opening/closing mechanism 115s, and so on.

The CPU 121a is configured to read and execute the control program from the memory 121c and is also configured to read the recipe from the memory 121c according to an input of an operation command from the input/output device 122. The CPU 121a is configured to control the flow rate adjusting operation of various kinds of gases by the MFCs 241a to 241e, the opening/closing operation of the valves 243a to 243e, the opening/closing operation of the APC valve 244, the pressure adjusting operation performed by the APC valve 244 based on the pressure sensor 245, the actuating and stopping operation of the vacuum pump 246, the temperature adjusting operation performed by the heater 207 based on the temperature sensor 263, the operation of rotating the boat 217 with the rotator 267 and adjusting the rotation speed of the boat 217, the operation of moving the boat 217 up and down by the boat elevator 115, the opening/closing operation of the shutter 219s by the shutter opening/closing mechanism 115s, and so on, according to contents of the read recipe.

The controller 121 may be configured by installing, on the computer, the aforementioned program stored in an external memory 123. Examples of the external memory 123 may include a magnetic disk such as a HDD, an optical disc such as a CD, a magneto-optical disc such as a MO, a semiconductor memory such as a USB memory, and the like. The memory 121c or the external memory 123 is configured as a computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. Furthermore, the program may be provided to the computer using communication means such as the Internet or a dedicated line, instead of using the external memory 123.

(2) Substrate Processing Process

Using the above-described substrate processing apparatus, as a process of manufacturing a semiconductor device, a substrate processing sequence example of repeatedly performing a step of supplying a process gas to an interior of a process container that accommodates a wafer 200 as a substrate to process the wafer 200 and a step of supplying a cleaning gas to the interior of the process container that does not accommodate the wafer 200 to clean the interior of the process container will be described. In the following descriptions, the operations of the respective parts constituting the substrate processing apparatus are controlled by the controller 121.

Figure 4A:
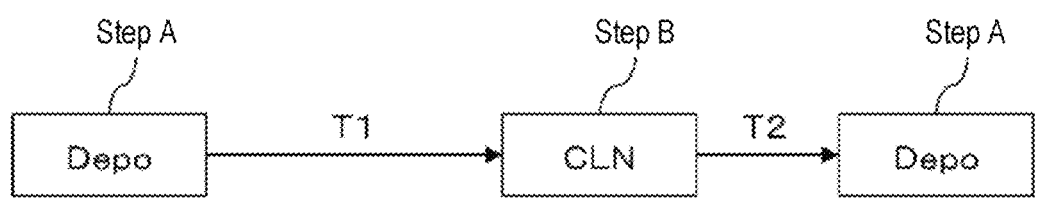
FIG. 4A is a diagram schematically showing a substrate processing sequence in an embodiment of the present disclosure.

As shown in FIG. 4A, the substrate processing sequence in the present embodiment includes:

a process of repeatedly performing:

step A (Depo) of executing a process recipe of processing a wafer 200 by supplying a MS gas as a process gas to an interior of a process container that accommodates the wafer 200 in a state in which the interior of the process container is heated; and step B (CLN) of executing a cleaning recipe of cleaning the interior of the process container by supplying a $F_2$ gas as a cleaning gas to the interior of the process container that does not accommodate the wafer 200 in the state in which the interior of the process container is heated, wherein time T2 until a start of step A after an end of step B is set to be equal to or less than time T1 until a start of step B after an end of step A.

Step B includes:

a step of supplying the $F_2$ gas as the cleaning gas to the interior of the process container that is set to a first temperature;

a step of raising a temperature of the interior of the process container from the first temperature to a second temperature;

a step of keeping the interior of the process container at the second temperature for a predetermined time; and a step of lowering the temperature of the interior of the process container from the second temperature to a processing temperature in step A.

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

[Step A]

First, step A (Depo) of executing a process recipe of processing a wafer 200 will be described.

(Wafer Charging and Boat Loading)

When the boat 217 is charged with a plurality of wafers 200 (wafer charging), the shutter 219s is moved by the shutter opening/closing mechanism 115s and the lower end opening of the manifold 209 is opened (shutter open). After that, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220b.

(Pressure Adjustment and Temperature Adjustment)

After the loading of the boat 217 into the process chamber 201 is completed, the interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information (pressure adjustment). Further, the wafers 200 in the process chamber 201 are heated by the heater 207 so as to have a desired processing temperature. At this time, the state of supplying electric power to the heater 207 is feedback-controlled based on the temperature information detected by the temperature sensor 263 so that the interior of the process chamber 201 has a desired temperature distribution. Further, the rotation of the boat 217 and the wafers 200 by the rotator 267 is started. The operation of the vacuum pump 246 and the heating and rotation of the wafers 200 are continuously performed at least until the processing on the wafers 200 is completed.

(Film Formation)

After the pressure adjustment and the temperature adjustment in the process chamber 201 are completed, a MS gas and a PH gas are supplied to a wafer 200 in the process chamber 201.

Specifically, the valve 243a is opened to allow the MS gas to flow into the gas supply pipe 232a. The flow rate of the MS gas is adjusted by the MFC 241a, and the MS gas is supplied into the process chamber 201 via the nozzle 249a and is exhausted through the exhaust port 231a. At this time, the valve 243b is opened to allow the PH gas to flow into the gas supply pipe 232b. The flow rate of the PH gas is adjusted by the MFC 241b, and the PH gas is supplied into the process chamber 201 via the nozzle 249b and is exhausted through the exhaust port 231a. In this operation, the MS gas and the PH gas are together and simultaneously supplied to the wafer 200 (MS gas+PH gas supply). Further, at this time, the valves 243d and 243e may be opened to allow a $N_2$ gas to flow into the process chamber 201 via the nozzles 249a and 249b, respectively.

The process conditions of this step are exemplified as follows.

MS gas supply flow rate: 0.001 to 10 slm
PH gas supply flow rate: 0.0001 to 2 slm
MS gas and PH gas supply time: 1 to 1,000 minutes
$N_2$ gas supply flow rate (for each gas supply pipe): 0 to 10 slm
Internal temperature of process chamber 201 (film formation temperature): 300 to 700 degrees C.
Internal pressure of process chamber 201 (film formation pressure): 1 to 10,000 Pa In the present disclosure, the notation of a numerical range such as "300 to 700 degrees C." means that the lower limit value and the upper limit value are included in the range. Therefore, for example, "300 to 700 degrees C." means "300 degrees C. or higher and 700 degrees C. or lower." The same applies to other numerical ranges.

By supplying the MS gas and the PH gas to the wafer 200 under the aforementioned processing conditions, it is possible to deposit Si on the surface of the wafer 200. As a result, it is possible to form a Si-containing film as a film, specifically, a Si film doped with P as a dopant (hereinafter, also referred to as a P-doped Si film or simply a Si film), on the wafer 200.

As a precursor gas, in addition to the MS gas, a silicon hydride gas such as a disilane ($Si_2H_6$) gas, a trisilane ($Si_3H_8$) gas, a tetrasilane ($Si_4H_{10}$) gas, a pentasilane ($Si_5H_{12}$) gas, or a hexasilane ($Si_6H_{14}$) gas can be used.

As a dopant gas, in addition to the PH gas, a gas containing arsenic (As) as a Group V element, such as an arsine ($AsH_3$) gas, can be used. Further, as the dopant gas, a gas containing boron (B) as a Group III element, such as a diborane ($B_2H_6$) gas or a trichloroborane ($BCl_3$) gas, can be used.

As an inert gas, in addition to the $N_2$ gas, a rare gas such as an Ar gas, a He gas, a Ne gas, or a Xe gas can be used. This point is the same in step B which will be described later.

(After-Purging and Returning to Atmospheric Pressure)

After the formation of the Si film on the wafer 200 is completed, the valves 243a and 243b are closed to stop the supply of the MS gas and the PH gas into the process chamber 201, respectively. Then, the interior of the process chamber 201 is vacuum-exhausted to remove a gas or the like remaining in the process chamber 201 from the process chamber 201. At this time, the valves 243d and 243e are opened to allow a $N_2$ gas as a purge gas to be supplied into the process chamber 201 from the nozzles 249a and 249b, respectively, and the $N_2$ gas is exhausted though the exhaust port 231a. As a result, the interior of the process chamber 201 is purged to remove a gas, reaction by-products, and the like remaining in the process chamber 201 from the process chamber 201 (after-purging). After that, the internal atmosphere of the process chamber 201 is substituted with an inert gas (inert gas substitution) and the internal pressure of the process chamber 201 is returned to the normal pressure (returning to atmospheric pressure).

(Boat Unloading and Wafer Discharging)

After that, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter close). The processed wafers 200 is unloaded out of the reaction tube 203 and then is discharged from the boat 217 (wafer discharging).

[Step B]

When the above-described step A is performed, deposits containing a thin film such as the Si film adhere to an interior of the process container, for example, an inner wall of the reaction tube 203, surfaces of the nozzles 249a and 249b, a surface of the boat 217, etc. That is, the deposits containing this thin film adhere to the surfaces of members in the process chamber 201 heated to the film formation temperature. Therefore, after step A is completed, step B (CLN) for executing a cleaning recipe for cleaning the interior of the process container is executed.

(Empty Boat Loading)

The shutter 219s is moved by the shutter opening/closing mechanism 115s to open the lower end opening of the manifold 209 (shutter open). After that, an empty boat 217, that is, a boat 217 not charged with the wafers 200, is lifted up by the boat elevator 115 and is loaded into the process chamber 201. In this state, the seal cap 219 seals the lower end of the manifold 209 via the O-ring 220b.

(Pressure Adjustment and Temperature Adjustment)

After the loading of the boat 217 into the process chamber 201 is completed, the interior of the process chamber 201 is vacuum-exhausted (temperature adjustment) by the vacuum pump 246 to reach a desired pressure. Further, the interior of the process chamber 201 is heated (temperature adjustment) by the heater 207 so as to have a desired temperature (first temperature). At this time, the members in the process chamber 201, that is, the inner wall of the reaction tube 203, the surfaces of the nozzles 249a and 249b, the surface of the boat 217, and the like are also heated to the first temperature. Further, the rotation of the boat 217 by the rotator 267 is started. The operation of the vacuum pump 246, the heating of the interior of the process chamber 201, and the rotation of the boat 217 are continuously performed at least until cleaning, which will be described below, is completed. The boat 217 may not be rotated.

(Cleaning)

After the pressure adjustment and temperature adjustment in the process chamber 201 are completed, a $F_2$ gas is supplied to the interior of the process chamber 201 that does not accommodate the wafer 200 in the state in which the interior of the process chamber 201 is heated. Specifically, the valve 243c is opened to allow the $F_2$ gas to flow into the gas supply pipe 232c. The flow rate of the $F_2$ gas is adjusted by the MFC 241c, and the $F_2$ gas is supplied into the process chamber 201 via the gas supply pipe 232a and the nozzle 249a and is exhausted though the exhaust port 231a. At the same time, the valves 243d and 243e may be opened to allow a $N_2$ gas to be supplied to the interior of the process chamber 201 via the nozzles 249a and 249b.

The process conditions of this step are exemplified as follows.

$F_2$ gas supply flow rate: 0.5 to 5 slm $N_2$ gas supply flow rate (for each gas supply pipe): 0 to 20 slm Each gas supply time: 1 to 60 minutes Internal temperature of process chamber 201 (first temperature): 200 to 400 degrees C.

Internal pressure of process chamber 201: 1,333 to 53,329 Pa

It is preferable that the first temperature is set to be lower than the processing temperature (film formation temperature) in step A.

By supplying the $F_2$ gas into the process chamber 201 under the aforementioned process conditions, it is possible to cause a thermochemical reaction (etching reaction) so that deposits adhered to the surfaces of the members in the process chamber 201, for example, the inner wall of the reaction tube 203, the surfaces of the nozzle 249a and 249b, the surface of the boat 217, etc. can be removed.

After the removal of the deposits is completed with a lapse of a predetermined time, the valve 243c is closed to stop the supply of the $F_2$ gas to the interior of the process chamber 201. Then, the interior of the process chamber 201 is purged to remove a gas and the like remaining in the process chamber 201 from the process chamber 201 according to the same process procedure as the above-described described after-purging in step A.

Then, at that time, the temperature of the interior of the process chamber 201 is raised from the first temperature to a second temperature. That is, in parallel with the purging in the process chamber 201, the temperature of the interior of the process chamber 201 is raised from the first temperature to the second temperature. At this time, members in the process chamber 201, that is, the inner wall of the reaction tube 203, the surfaces of the nozzles 249a and 249b, the surface of the boat 217, and the like also rise to the second temperature. As a result, since the interior of the process chamber 201 can be purged in a state where the temperature of the interior of the process chamber 201 has been raised from the first temperature to the second temperature, it is possible to not only remove a gas remaining in the process chamber 201 from the process chamber 201, but also desorb and remove cleaning residues, residual fluorine, etc., which have adhered to and remained inside the process chamber 201, from the process chamber 201. Hereinafter, this purge is also referred to as a temperature rise purge. It is preferable that the second temperature is set to be higher than the processing temperature (film formation temperature) in step A.

Process conditions of this step (temperature rise purge) are exemplified as follows.

$N_2$ gas supply flow rate (for each gas supply pipe): 20 to 50 slm, specifically 30 to 50 slm N$_2$ gas supply time: 1 to 40 minutes Internal temperature of process chamber 201 at the start of temperature rise (first temperature): 200 to 400 degrees C.

Internal temperature of process chamber 201 at the end of temperature rise (second temperature): 600 to 800 degrees C.

Internal pressure of process chamber 201: 1 to 101,325 Pa

After the internal temperature of the process chamber 201 reaches the second temperature, the internal temperature of the process chamber 201 is kept at the second temperature for a predetermined time. That is, in parallel with the purging in the process chamber 201, the internal temperature of the process chamber 201 is kept at the second temperature for a predetermined time. At this time, the members in the process chamber 201, that is, the internal wall of the reaction tube 203, the surfaces of the nozzles 249a and 249b, the surface of the boat 217, and the like are also kept at the second temperature. As a result, since the interior of the process chamber 201 can be purged in a state where it has been heated to the second temperature, it is possible to not only remove a residual gas, which could not be completely removed by the temperature rise purge, from the process chamber 201, but also desorb and remove cleaning residues, residual fluorine, etc., which have adhered to and remained inside the process chamber 201 and could not be completely removed by the temperature rise purge, from the process chamber 201. Hereinafter, this purge is also referred to as a high temperature purge.

The process conditions of this step (high temperature purge) are exemplified as follows.

N$_2$ gas supply flow rate (for each gas supply pipe): 20 to 50 slm, specifically 30 to 50 slm N$_2$ gas supply time: 1 to 40 minutes Internal temperature of process chamber 201 (second temperature): 600 to 800 degrees C.

Internal pressure of process chamber 201: 1 to 101,325 Pa

After that, the temperature of the interior of the process chamber 201 is lowered from the second temperature to the processing temperature (film formation temperature) in step A. It is preferable to maintain the interior of the process chamber 201 in a purged state even when the internal temperature of the process chamber 201 is lowered. As a result, it is possible to not only remove a residual gas, which could not be completely removed by the high temperature purge, from the process chamber 201, but also desorb and remove cleaning residues, residual fluorine, etc., which have adhered to and remained inside the process chamber 201 and could not be completely removed by the high temperature purge, from the process chamber 201. Hereinafter, this purge is also referred to as a temperature fall purge. Process conditions other than a temperature condition at this time can be the same as, for example, the process conditions in the temperature rise purge and the high temperature purge. When the removal of residual gas, cleaning residues, residual fluorine, etc. is completed by the high temperature purge, it is preferable that the N$_2$ gas supply flow rate in the temperature fall purge is made lower than the N$_2$ gas supply flow rate in the temperature rise purge and the high temperature purge. This makes it possible to reduce the gas cost.

Further, it is preferable that at least the N$_2$ gas supply flow rate in the temperature rise purge and the high temperature purge is higher than the N$_2$ gas supply flow rate in the after-purging in step A. For example, when the N$_2$ gas supply flow rate in the after-purging in step A is set to 0.5 to 10 slm, the N$_2$ gas supply flow rate in the temperature rise purge and the high temperature purge can be set to 20 to 50 slm. Further, the N$_2$ gas supply flow rate in the temperature rise purge, the high temperature purge, and the temperature fall purge may be made higher than the N$_2$ gas supply flow rate in the after-purging in step A. By making the N$_2$ gas supply flow rate in the temperature rise purge, the high temperature purge, and the temperature fall purge higher than the N$_2$ gas supply flow rate in the after-purging, it is possible to improve the removal efficiency of, in particular, cleaning residues, residual fluorine, etc.

Further, it is preferable that a maximum temperature of the interior of the process container in above-described step A is different from the maximum temperature of the interior of the process container in the above-described step B. Specifically, it is preferable that the maximum temperature of the interior of the process container in step B is higher than the maximum temperature of the interior of the process container in step A. By doing so, it is possible to efficiently proceed with the cleaning of the interior of the process container.

As a cleaning gas, in addition to the F$_2$ gas, a hydrogen fluoride (HF) gas, a nitrogen fluoride (NF$_3$) gas, a chlorine fluoride (ClF$_3$) gas, or a mixture thereof can be used. Further, as the cleaning gas, a mixed gas obtained by adding a nitrogen oxide-based gas such as a nitric oxide (NO) gas or a nitrous oxide (N$_2$O) gas to these F-containing gases can be used. Further, as the cleaning gas, in addition to the F-containing gas, a halogen-containing gas such as a chlorine (Cl$_2$) gas or a hydrogen chloride (HCl) gas other than the F-containing gas can be used.

[Repetition Step]

After that, steps A and B are repeatedly performed. In the present embodiment, when step A and step B are repeatedly performed, a step of performing step A once and a step of performing step B once are alternately repeatedly performed. That is, step B is performed every time step A is performed.

At this time, as described above, time T2 until the start of step A after the end of step B is set to be equal to or less than time T1 until the start of step B after the end of step A (T2≤T1). Preferably, time T2 is less than time T1 (T2<T1). Various settings can be made for T1 and T2 as long as T2≤T1, but it is preferable that T2 is set to less than 1 hour, specifically 0.5 hour or less, more specifically less than 0.5 hour in order to obtain the effects which will be described later. For T1 and T2, for example, the following times can be suitably selected.

T1=1 hour, T2=0.1 hour
T1=2 hours, T2=0.2 hour
T1=3 hours, T2=0.3 hour
T1=4 hours, T2=0.4 hour (3) Effects of the Present Embodiment According to the present embodiment, one or more effects set forth below may be achieved.

Figure 4B:
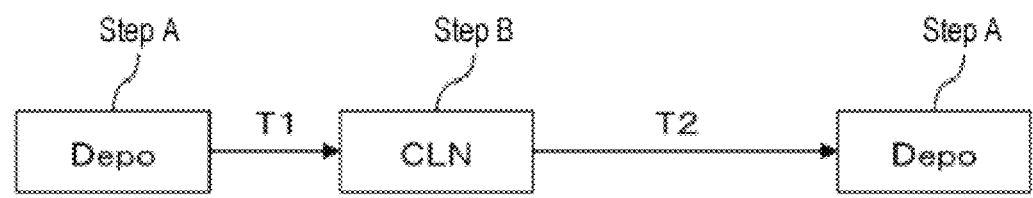
FIG. 4B is a diagram schematically showing a substrate processing sequence in a reference example.

(a) When steps A and B are repeated alternately, as shown in FIG. 4A, by setting time T2 until the start of step A after the end of step B to be equal to or less than time T1 until the start of step B after the end of step A (T2≤T1), it is possible to improve the characteristics of the Si film formed on the wafer 200 as compared with a case where T2>T1 as in a reference example shown in FIG. 4B. Specifically, it is possible to improve the film quality of the Si film formed on the wafer 200 and to improve the controllability of the film thickness.

(b) When steps A and B are repeated alternately, as shown in FIG. 4A, by setting time T2 until the start of step A after the end of step B to be equal to or less than time T1 until the start of step B after the end of step A (T2≤T1), it is possible to improve the reproducibility of the characteristics of the Si film formed on the wafer 200 as compared with the case where T2>T1 as in the reference example shown in FIG. 4B. Specifically, it is possible to improve the reproducibility of the film quality of the Si film formed on the wafer 200 and the reproducibility of the film thickness.

(c) When steps A and B are repeated alternately, by setting time T2 until the start of step A after the end of step B to be less than time T1 until the start of step B after the end of step A (T2≤T1), the above-described various effects can be obtained more reliably.

(d) In step B, by setting the first temperature to be lower than the processing temperature (film formation temperature) in step A, it is possible to suppress damage due to corrosion of a metal member in the process container by the $F_2$ gas and damage due to etching of a quartz member in the process container. Further, in step B, by setting the second temperature to be higher than the processing temperature (film formation temperature) in step A, it is possible to effectively desorb the cleaning residues, residual fluorine, etc. which have adhered to and remained in the process container.

(e) When the temperature of the interior of the process container is raised from the first temperature to the second temperature in step B, by supplying the $N_2$ gas to the interior of the process container and exhausting the $N_2$ gas from the interior of the process container, it is possible to efficiently remove the cleaning residues, residual fluorine, etc., which are desorbed by raising the temperature of the interior of the process container, from the process chamber 201. Further, in step B, when the interior of the process container is kept at the second temperature for a predetermined time, by supplying the $N_2$ gas to the interior of the process container and exhausting the $N_2$ gas from the interior of the process container, it is possible to efficiently remove the cleaning residues, residual fluorine, etc., which are desorbed by keeping the temperature of the interior of the process container at the second temperature, from the process chamber 201. Further, when the temperature of the interior of the process container is raised from the first temperature to the second temperature, that is, when the temperature rise is completed, if all the cleaning residues, residual fluorine, etc. can be removed from the interior of the process container, it is not always necessary to keep the temperature of the interior of the process container at the second temperature, which may be omitted.

(f) The effects of the present embodiment can be similarly obtained even when a precursor gas other than the MS gas is used, when a dopant gas other than the PH gas is used, when a cleaning gas other than the $F_2$ gas is used, and when an inert gas other than the $N_2$ gas is used.

(4) Modifications

The substrate processing sequence in the present embodiment may be changed as in the following modifications. These modifications can be arbitrarily combined. Unless otherwise stated, the processing procedure and process conditions in each step of each modification can be the same as the processing procedure and process conditions in each step of the above-described substrate processing sequence.
(Modification 1)

In addition to steps A and B, the substrate processing sequence may further include step C of performing a process of maintaining the state in which the interior of the process container is heated, without supplying any of the MS gas, the PH gas, and the $F_2$ gas to the interior of the process container that does not accommodate the wafer 200 in the state in which the interior of the process container is heated. Further, the substrate processing sequence may further include step C of executing a recipe (idling recipe) defined to perform such a process. Then, step C may be performed after the end of step A and before the start of step B. That is, a cycle that performs steps A, C, and B in this order may be repeated. In this case, since step B is started with a lapse of a predetermined time after the end of step A (by setting T1 to a predetermined length of time), it is easy to set T2≤T1, which is more likely to obtain the same effects as the above-described embodiment. Further, when performing step C, it is preferable that the valves 243*d* and 243*e* are opened to allow a $N_2$ gas to be supplied to the interior of the process chamber 201 from the nozzles 249*a* and 249*b*, respectively, and the $N_2$ gas is exhausted though the exhaust port 231*a* so that the interior of the process chamber 201 is maintained in a gas-purged state. This makes it possible to keep the internal atmosphere of the process chamber 201 in a clean state. The $N_2$ gas supply flow rate at this time is preferably lower than the $N_2$ gas supply flow rate in the temperature rise purge or the high temperature purge, and may be, for example, 0.1 to 2 slm.

Modification 2

In a period until the start of step A after the end of step B, step C in the above-described Modification 1 may not be performed. For example, step A may be started immediately after the end of step B. That is, time T2 from the end of step B to the start of step A may be set to substantially 0 hour. Various settings can be made for T1 and T2 as long as T2≤T1. For example, the following times can be suitably selected.

T1=1 hour, T2=0 hour
T1=2 hours, T2=0 hour
T1=3 hours, T2=0 hour
T1=4 hours, T2=0 hour This modification can also obtain the same effects as the above-described embodiment. Further, by setting T2 to substantially 0 hour, it is possible to further enhance the various effects obtained by the above-described embodiment. Further, it is possible to shorten the cycle time of the cycle that performs steps A, C, and B in this order, thereby improving the productivity of substrate processing.

Modification 3

In a period until the start of step B after the end of step A, step C in the above-described Modification 1 may not be performed. For example, when step A is started immediately after the end of step B, step B may be started immediately after the end of step A. That is, as shown below, time T2 from the end of step B to the start of step A may be set to substantially 0 hour, and further, time T1 from the end of step A to the start of step B may be set to substantially 0 hour.

T1=0 hour, T2=0 hour

This modification can also obtain the same effects as the above-described embodiment. Further, by setting both T1 and T2 to substantially 0 hour, it is possible to further shorten the cycle time of the cycle that performs steps A and B in this order, thereby further improving the productivity of substrate processing.

Modification 4

When repeatedly performing step A and step B, a step of performing step A multiple times and a step of performing step B once may be alternately repeated. That is, step B may be performed every time step A is performed multiple times. This modification can also obtain the same effects as the above-described embodiment. Further, by appropriately reducing the frequency of performing step B, it is possible to suppress an increase in the gas cost and improve the productivity of substrate processing.

OTHER EMBODIMENTS OF THE PRESENT DISCLOSURE

The embodiment of the present disclosure has been specifically described above. However, the present disclosure is not limited to the above-described embodiment, and various changes can be made without departing from the gist of the present disclosure.

Recipes used in each process may be prepared individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

The example in which a film is formed using a batch-type substrate processing apparatus capable of processing a plurality of substrates at a time has been described in the above-described embodiment. The present disclosure is not limited to the above-described embodiment, but may be suitably applied, for example, to a case where a film is formed using a single-wafer type substrate processing apparatus capable of processing a single substrate or several substrates at a time. In addition, the example in which a film is formed using a substrate processing apparatus provided with a hot-wall-type process furnace has been described in the above-described embodiment. The present disclosure is not limited to the above-described embodiment, but may be suitably applied to a case where a film is formed using a substrate processing apparatus provided with a cold-wall-type process furnace.

Even in the case of using these substrate processing apparatuses, each process may be performed according to the same processing procedures and process conditions as those in the above-described embodiment, and the same effects as those in the above-described embodiment can be achieved.

The above-described embodiments may be used in proper combination. The processing procedures and process conditions used in this case may be the same as, for example, the processing procedures and process conditions of the above-described embodiments.

ASPECTS OF PRESENT DISCLOSURE

Hereinafter, some aspects of the present disclosure will be additionally described as supplementary notes.

Supplementary Note 1

According to one aspect of the present disclosure, there is provided a method of manufacturing a semiconductor device or a method of processing a substrate, including:
  performing a cycle a predetermined number of times, the cycle including:
    (a) executing a process recipe of processing the substrate by supplying a process gas to an interior of a process container that accommodates the substrate in a state in which the interior of the process container is heated; and
    (b) executing a cleaning recipe of cleaning the interior of the process container by supplying a cleaning gas to the interior of the process container that does not accommodate the substrate in the state in which the interior of the process container is heated,
  wherein a time from an end of (b) in the cycle until a start of (a) in a next cycle is set to be equal to or less than a time from an end of (a) in the cycle until a start of (b) in the cycle.

Supplementary Note 2

The method of Supplementary Note 1, further including: (c) maintaining the state in which the interior of the process container is heated, without supplying the process gas and the cleaning gas to the interior of the process container that does not accommodate the substrate in the state in which the interior of the process container is heated (executing the recipes),
  wherein (c) is not performed in the time from the end of (b) in the cycle until the start of (a) in the next cycle.

Supplementary Note 3

The method of Supplementary Note 2, wherein (c) is performed in the time from the end of (a) in the cycle until the start of (b) in the cycle.

Supplementary Note 4

The method of Supplementary Note 2, wherein (c) is not performed in the time from the end of (a) in the cycle until the start of (b) in the cycle.

Supplementary Note 5

The method of any one of Supplementary Notes 1 to 4, wherein (a) is started immediately after the end of (b).

Supplementary Note 6

The method of Supplementary Note 5, wherein (b) is started with a lapse of a predetermined time after the end of (a).

Supplementary Note 7

The method of Supplementary Note 5, wherein (b) is started immediately after the end of (a).

Supplementary Note 8

The method of any one of Supplementary Notes 1 to 7, wherein the time from the end of (b) in the cycle until the start of (a) in the next cycle is set to 0 hour.

Supplementary Note 9

The method of Supplementary Note 8, wherein the time from the end of (a) in the cycle until the start of (b) in the cycle is set to 0 hour.

Supplementary Note 10

The method of any one of Supplementary Notes 1 to 9, wherein a maximum temperature of the interior of the process container in (a) is different from the maximum temperature of the interior of the process container in (b).

Supplementary Note 11

The method of Supplementary Note 10, wherein the maximum temperature of the interior of the process container in (b) is higher than the maximum temperature of the interior of the process container in (a).

Supplementary Note 12

The method of Supplementary Note 10 or 11, wherein (b) includes:
- (b1) supplying the cleaning gas to the interior of the process container that is set to a first temperature;
- (b2) raising a temperature of the interior of the process container from the first temperature to a second temperature; and
- (b3) lowering the temperature of the interior of the process container from the second temperature to a processing temperature in (a).

In (b2), after raising the temperature of the interior of the process container to a second temperature, the interior of the process container may be kept at the second temperature for a predetermined time.

Supplementary Note 13

The method of Supplementary Note 12, wherein the first temperature is lower than the processing temperature in (a), and the second temperature is higher than the processing temperature in (a).

Supplementary Note 14

The method of Supplementary Note 12 or 13, wherein in (b2), an inert gas is supplied into the process container and is exhausted from the process container. Further, in (b3), an inert gas is supplied into the process container and is exhausted from the process container.

Supplementary Note 15

The method of any one of Supplementary Notes 1 to 14, wherein the cleaning gas is a halogen-containing gas. The halogen-containing gas is a fluorine-containing gas.

Supplementary Note 16

The method of any one of Supplementary Notes 1 to 15, wherein in (a), a process of forming a film on the substrate is performed. The film is a silicon-containing film. The silicon-containing film is a silicon film. The silicon film is a silicon film doped with a dopant.

Supplementary Note 17

The method of any one of Supplementary Notes 1 to 16, wherein the cycle includes alternately and repeatedly performing (a) once and performing (b) once. That is, (b) is performed every time (a) is performed once.

Supplementary Note 18

The method of any one of Supplementary Notes 1 to 16, wherein the cycle includes alternately and repeatedly performing (a) multiple times and performing (b) once. That is, (b) is performed every time (a) is performed multiple times.

Supplementary Note 19

According to another aspect of the present disclosure, there is provided a substrate processing apparatus including:
- a process container in which a substrate is processed;
- a heater configured to heat an interior of the process container;
- a process gas supply system configured to supply a process gas to the interior of the process container;
- a cleaning gas supply system configured to supply a cleaning gas to the interior of the process container; and
- a controller configured to be capable of controlling the heater, the process gas supply system, and the cleaning gas supply system so as to perform each process (each step) of Supplementary Note 1.

Supplementary Note 20

According to another aspect of the present disclosure, there is provided a program that causes, by a computer, a substrate processing apparatus to perform each process (each step) of Supplementary Note 1, or a non-transitory computer-readable recording medium storing the program.

According to the present disclosure in some embodiments, it is possible to improve the characteristics of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device comprising:
    performing a cycle a predetermined number of times, the cycle including:
    (a) executing a process recipe of processing the substrate by supplying a process gas to an interior of a process container in a state in which the interior of the process container is heated, wherein the process container accommodates the substrate; and
    (b) executing a cleaning recipe of cleaning the interior of the process container by supplying a cleaning gas to the interior of the process container in the state in which the interior of the process container is heated, wherein the process container does not accommodate the substrate, wherein a time from an end of (b) in the cycle until a start of (a) in a next cycle is set to be less than a time from an end of (a) in the cycle until a start of (b) in the cycle, and wherein the time from the end of (a) in the cycle until the start of (b) in the cycle is set to 1 hour or more, and the time from the end of (b) in the cycle until the start of (a) in the next cycle is set to less than 1 hour.

2. A method of processing a substrate, comprising:
performing a cycle a predetermined number of times, the cycle including:
(a) executing a process recipe of processing the substrate by supplying a process gas to an interior of a process container, wherein the process container accommodates the substrate in a state in which the interior of the process container is heated; and
(b) executing a cleaning recipe of cleaning the interior of the process container by supplying a cleaning gas to the interior of the process container, wherein the process container does not accommodate the substrate in the state in which the interior of the process container is heated, wherein a time from an end of (b) in the cycle until a start of (a) in a next cycle is set to be less than a time from an end of (a) in the cycle until a start of (b) in the cycle, and wherein the time from the end of (a) in the cycle until the start of (b) in the cycle is set to 1 hour or more, and the time from the end of (b) in the cycle until the start of (a) in the next cycle is set to less than 1 hour.

3. The method of claim 2, wherein the cleaning gas is a halogen-containing gas.

4. The method of claim 2, wherein (a) includes forming a film on the substrate.

5. The method of claim 2, wherein the cycle includes alternately and repeatedly performing (a) once and performing (b) once.

6. The method of claim 2, wherein the cycle includes alternately and repeatedly performing (a) multiple times and performing (b) once.

7. The method of claim 2, wherein the time from the end of (b) in the cycle until the start of (a) in the next cycle is set to 0 hour.

8. The method of claim 7, wherein the time from the end of (a) in the cycle until the start of (b) in the cycle is set to 0 hour.

9. The method of claim 2, further comprising:
(c) maintaining the state in which the interior of the process container is heated, without supplying the process gas and the cleaning gas to the interior of the process container, wherein the process container does not accommodate the substrate in the state in which the interior of the process container is heated, wherein (c) is not performed in the time from the end of (b) in the cycle until the start of (a) in the next cycle.

10. The method of claim 9, wherein (c) is performed in the time from the end of (a) in the cycle until the start of (b) in the cycle.

11. The method of claim 9, wherein (c) is not performed in the time from the end of (a) in the cycle until the start of (b) in the cycle.

12. The method of claim 2, wherein (a) is started immediately after the end of (b).

13. The method of claim 12, wherein (b) is started with a lapse of a predetermined time after the end of (a).

14. The method of claim 12, wherein (b) is started immediately after the end of (a).

15. The method of claim 2, wherein a maximum temperature of the interior of the process container in (a) is different from the maximum temperature of the interior of the process container in (b).

16. The method of claim 15, wherein the maximum temperature of the interior of the process container in (b) is higher than the maximum temperature of the interior of the process container in (a).

17. The method of claim 15, wherein (b) includes:
(b1) supplying the cleaning gas to the interior of the process container, wherein the process container is set to a first temperature;
(b2) raising a temperature of the interior of the process container from the first temperature to a second temperature; and
(b3) lowering the temperature of the interior of the process container from the second temperature to a processing temperature in (a).

18. The method of claim 17, wherein the first temperature is lower than the processing temperature in (a), and the second temperature is higher than the processing temperature in (a).

19. The method of claim 17, wherein in (b2), an inert gas is supplied into the process container and is exhausted from the process container.

20. The method of claim 17, wherein in (a), a purge gas is supplied to the interior of the process container after the process gas is supplied,
wherein in (b2), a purge gas is supplied to the interior of the process container, and
wherein a flow rate of the purge gas supplied in (b2) is higher than a flow rate of the purge gas supplied in (a).

21. The method of claim 20, wherein the flow rate of the purge gas supplied in (a) is set to be in a rage of 0.5 to 10 slm, and the flow rate of the purge gas supplied in (b2) is set to be in a range of 20 to 50 slm.

22. A substrate processing apparatus comprising:
a process container in which a substrate is processed;
a heater configured to heat an interior of the process container;
a process gas supply system configured to supply a process gas to the interior of the process container;
a cleaning gas supply system configured to supply a cleaning gas to the interior of the process container; and
a controller configured to be capable of controlling the heater, the process gas supply system, and the cleaning gas supply system so as to perform a process including: performing a cycle a predetermined number of times, the cycle including: (a) executing a process recipe of processing the substrate by supplying the process gas to the interior of the process container, wherein the process container accommodates the substrate in a state in which the interior of the process container is heated; and (b) executing a cleaning recipe of cleaning the interior of the process container by supplying the cleaning gas to the interior of the process container, wherein the process container does not accommodate the substrate in the state in which the interior of the process container is heated, wherein a time from an end of (b) in the cycle until a start of (a) in a next cycle is set to be less than a time from an end of (a) in the cycle until a start of (b) in the cycle, and wherein the time from the end of (a) in the cycle until the start of (b) in the cycle is set to 1 hour or more, and the time from the end of (b) in the cycle until the start of (a) in the next cycle is set to less than 1 hour.

23. A non-transitory computer-readable recording medium storing a program that causes, by a computer, a substrate processing apparatus to perform a process comprising:

performing a cycle a predetermined number of times, the cycle including:
(a) executing a process recipe of processing a substrate by supplying a process gas to an interior of a process container, wherein the process container accommodates the substrate in a state in which the interior of the process container is heated; and
(b) executing a cleaning recipe of cleaning the interior of the process container by supplying a cleaning gas to the interior of the process container, wherein the process container does not accommodate the substrate in the state in which the interior of the process container is heated, wherein a time from an end of (b) in the cycle until a start of (a) in a next cycle is set to be less than a time from an end of (a) in the cycle until a start of (b) in the cycle, and wherein the time from the end of (a) in the cycle until the start of (b) in the cycle is set to 1 hour or more, and the time from the end of (b) in the cycle until the start of (a) in the next cycle is set to less than 1 hour.

\* \* \* \* \*